(12) United States Patent
Ahmed et al.

(10) Patent No.: US 8,840,770 B2
(45) Date of Patent: *Sep. 23, 2014

(54) METHOD AND CHEMISTRY FOR SELENIUM ELECTRODEPOSITION

(75) Inventors: Shafaat Ahmed, Yorktown Heights, NY (US); Hariklia Deligianni, Tenafly, NJ (US)

(73) Assignee: International Business Machines Corporation, Armonk, NY (US)

( * ) Notice: Subject to any disclaimer, the term of this patent is extended or adjusted under 35 U.S.C. 154(b) by 391 days.

This patent is subject to a terminal disclaimer.

(21) Appl. No.: 12/878,811

(22) Filed: Sep. 9, 2010

(65) Prior Publication Data

US 2012/0061247 A1    Mar. 15, 2012

(51) Int. Cl.
*C25D 3/02* (2006.01)
*H01L 31/0272* (2006.01)
*C25D 5/50* (2006.01)
*C25D 3/54* (2006.01)
*C25D 3/56* (2006.01)
*H01L 31/032* (2006.01)
*C25D 9/04* (2006.01)

(52) U.S. Cl.
CPC ............ *C25D 3/54* (2013.01); *H01L 31/0272* (2013.01); *C25D 5/50* (2013.01); *C25D 9/04* (2013.01); *C25D 3/56* (2013.01); *H01L 31/0322* (2013.01); *Y02E 10/541* (2013.01)
USPC ....................................... 205/261

(58) Field of Classification Search
USPC .................. 205/238, 239, 240, 244, 253, 261
See application file for complete search history.

(56) References Cited

U.S. PATENT DOCUMENTS

| 2,649,409 A | 8/1953 | von Hippel et al. |
| 5,489,372 A | 2/1996 | Hirano |

(Continued)

FOREIGN PATENT DOCUMENTS

EP    2128903 A1 * 12/2009    ............ H01L 31/032

OTHER PUBLICATIONS

Boulanger, "Thermoelectric Material Electroplating: A Historical Review". J. of Electronic Materials (no month, 2010), vol. 39, No. 9, pp. 1818-1827.*

(Continued)

*Primary Examiner* — Edna Wong
(74) *Attorney, Agent, or Firm* — Vazken Alexanian; Michael J. Chang, LLC

(57) ABSTRACT

Techniques for electrodepositing selenium (Se)-containing films are provided. In one aspect, a method of preparing a Se electroplating solution is provided. The method includes the following steps. The solution is formed from a mixture of selenium oxide; an acid selected from the group consisting of alkane sulfonic acid, alkene sulfonic acid, aryl sulfonic acid, heterocyclic sulfonic acid, aromatic sulfonic acid and perchloric acid; and a solvent. A pH of the solution is then adjusted to from about 2.0 to about 3.0. The pH of the solution can be adjusted to from about 2.0 to about 3.0 by adding a base (e.g., sodium hydroxide) to the solution. A Se electroplating solution, an electroplating method and a method for fabricating a photovoltaic device are also provided.

17 Claims, 12 Drawing Sheets

(56) References Cited

U.S. PATENT DOCUMENTS

| | | | |
|---|---|---|---|
| 6,653,701 | B1 | 11/2003 | Yamazaki et al. |
| 7,297,868 | B2 | 11/2007 | Bhattacharya |
| 8,545,689 | B2 * | 10/2013 | Ahmed et al. ............... 205/239 |
| 2009/0283411 | A1 | 11/2009 | Aksu et al. |
| 2009/0283415 | A1 * | 11/2009 | Aksu et al. ................ 205/239 |
| 2010/0140098 | A1 * | 6/2010 | Uzoh et al. .................. 205/96 |
| 2010/0140101 | A1 | 6/2010 | Aksu et al. |
| 2012/0055801 | A1 * | 3/2012 | Ahmed et al. ............... 205/158 |

OTHER PUBLICATIONS

A.K. Graham et al. "Electrodeposition of Amorphous Selenium," JECS, vol. 106. Issue 8, pp. 651-654 (1959). (Aug. 1959).

Mahalingam et al, "Studies of Electrosynthesized Zinc Selenide Thin Films," Journal of New Materials for Electrochemical Systems, vol. 10. pp. 15-19 (2007). (May 2007).

I. Nandhakumar et al., "Electrodeposition of Nenostructured Mesoporous Selenium Films (HI-eSe)," Chem. Mater. vol. 13, 2001, pp. 3840-3642. (Sep. 2001).

* cited by examiner

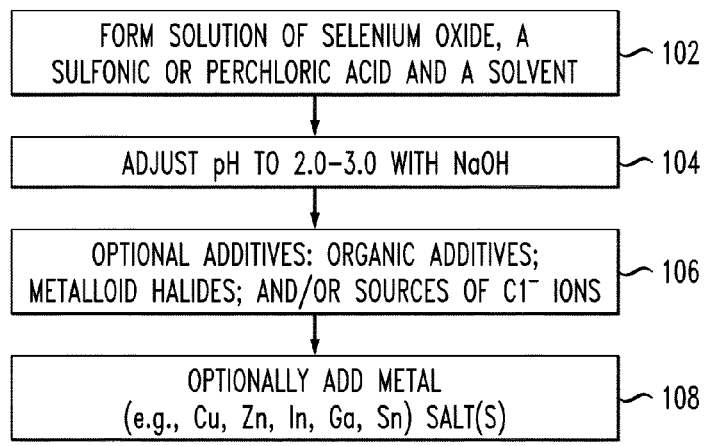
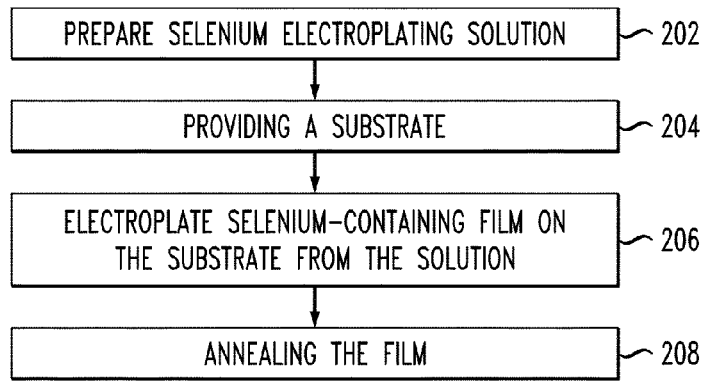
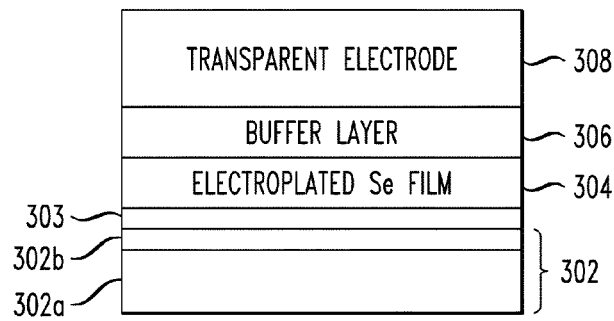

400

500

600A

600B

600C

600D

700A

|—200nm—| AS PLATED

700B

200nm  Mag=50.00KX         Date:23Feb2010
|—|     WD=30mm  EHT=5.00kV  File Name=SeMSA2hrannealedat100c

AFTER ANNEALED AT 100C FOR 1HR

900

1000A

1000B

1000C

1000D

FIG. 11A
1100A
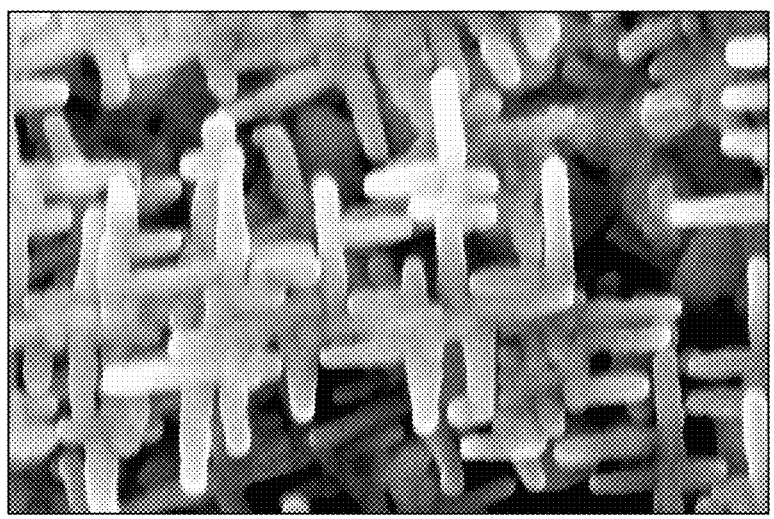
FIG. 11B
1100B
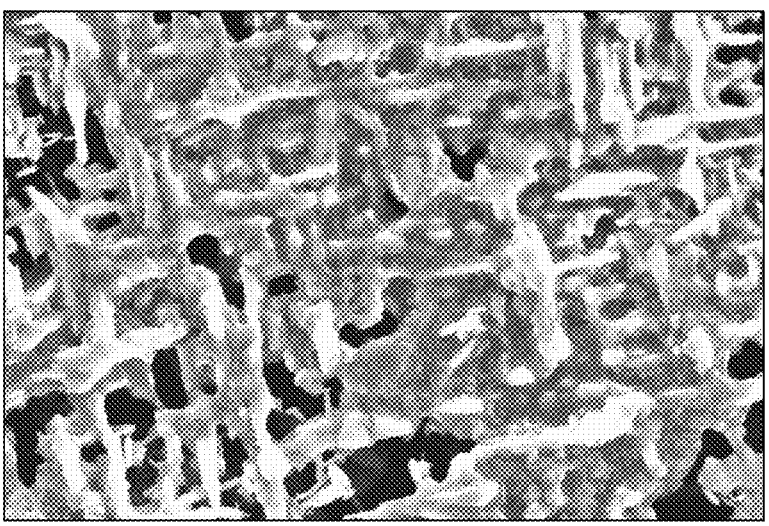
200 nm  Mag=25.00KX        Date: 23 Feb 2010
  WD=2.7mm    EHT=5.00kV  File Name=SeMSAcu2hrannealedat10

1200

1400A

1400B

1400C

1400D

1500A

1500B

METHOD AND CHEMISTRY FOR SELENIUM ELECTRODEPOSITION

FIELD OF THE INVENTION

The present invention relates to electrodeposition and more particularly, to techniques for electrodepositing selenium (Se)-containing films.

BACKGROUND OF THE INVENTION

Selenium (Se) has been used for the production of solid-state photoelements and current rectifiers. Se, however, has potential application in semiconductor liquid junction solar cells and before the introduction of digital photography it was used in the reproduction of photographs. In the solid state, Se has several allotropic forms. Crystalline allotropes of Se include two monoclinic forms and one hexagonal form. The amorphous and monoclinic forms of Se are dark red to black and red, respectively. The hexagonal form is a semiconductor and it is gray. See, for example, A. K. Graham et al. "Electrodeposition of Amorphous Selenium," *JECS*, vol. 106, issue 8, pgs. 651-654 (1959) (hereinafter "Graham"). At room temperature, Se is a p-type semiconductor with a bandgap energy of $Eg=1.9$ eV exhibiting a direct optical transition with a correspondingly high absorption coefficient.

Recently, there has been a demand for copper indium selenide (CIS), copper indium gallium selenide (CIGS) and copper zinc tin sulfide (CZTS) materials, all of which contain Se. These materials are being used as absorber layers in photovoltaic devices. To form the absorber layer, evaporation methods are typically employed to deposit the various components of the material. Evaporation methods, however, are expensive, deposition rate is very low and a lot of material is lost during the process.

It is known that plating of Se-containing thin films by electrochemical methods (electrodeposition) is extremely difficult due the non-adherent, powdery and resistive nature of Se. There is very little literature on the electroplating of Se films. In a few studies researchers were able to plate, at best, a few monolayers of amorphous and resistive Se. See, for example, Graham (wherein amorphous Se was electroplated on nickel (Ni) up to a thickness of 30 micrometers (μm)). There is a large body of literature on Se being plated as an alloy with copper, indium and gallium (CIS/CIGS-alloy), but these studies do not apply to electroplating only Se.

Therefore, improved techniques for electrodepositing Se-containing films would be desirable.

SUMMARY OF THE INVENTION

The present invention provides techniques for electrodepositing selenium (Se)-containing films. In one aspect of the invention, a method of preparing a Se electroplating solution is provided. The method includes the following steps. The solution is formed from a mixture of selenium oxide; an acid selected from the group consisting of alkane sulfonic acid, alkene sulfonic acid, aryl sulfonic acid, heterocyclic sulfonic acid, aromatic sulfonic acid and perchloric acid; and a solvent. A pH of the solution is then adjusted to from about 2.0 to about 3.0. The pH of the solution can be adjusted to from about 2.0 to about 3.0 by adding a base (e.g., sodium hydroxide (NaOH)) to the solution.

In another aspect of the invention, a Se electroplating solution is provided. The solution includes selenium oxide; an acid selected from the group consisting of alkane sulfonic acid, alkene sulfonic acid, aryl sulfonic acid, heterocyclic sulfonic acid, aromatic sulfonic acid and perchloric acid; a solvent; and a base, wherein a pH of the solution is from about 2.0 to about 3.0.

In yet another aspect of the invention, an electroplating method is provided. The method includes the following steps. A Se electroplating solution is prepared by the steps of: forming the solution from a mixture comprising selenium oxide, an acid selected from the group consisting of alkane sulfonic acid, alkene sulfonic acid, aryl sulfonic acid, heterocyclic sulfonic acid, aromatic sulfonic acid and perchloric acid and a solvent; and adjusting a pH of the solution to from about 2.0 to about 3.0. A substrate is provided. A Se-containing film is electroplated on the substrate using the solution as a plating bath.

In still yet another aspect of the invention, a method for fabricating a photovoltaic device is provided. The method includes the following steps. A Se electroplating solution is prepared. The solution includes selenium oxide; an acid selected from the group consisting of alkane sulfonic acid, alkene sulfonic acid, aryl sulfonic acid, heterocyclic sulfonic acid, aromatic sulfonic acid and perchloric acid; a solvent; at least one metal salt; and a base, wherein a pH of the solution is from about 2.0 to about 3.0. A substrate is provided. A Se-containing absorber layer is electroplated on the substrate using the solution as a plating bath. A buffer layer is formed on the absorber layer. A transparent electrode is formed on the buffer layer.

A more complete understanding of the present invention, as well as further features and advantages of the present invention, will be obtained by reference to the following detailed description and drawings.

BRIEF DESCRIPTION OF THE DRAWINGS

FIG. 1 is a diagram illustrating an exemplary methodology for preparing a selenium (Se) electroplating solution according to an embodiment of the present invention;

FIG. 2 is a diagram illustrating an exemplary methodology for forming a Se-containing film according to an embodiment of the present invention;

FIG. 3 is a diagram illustrating an exemplary photovoltaic device having an absorber layer that may be fabricated using the methodology of FIG. 2 according to an embodiment of the present invention;

FIG. 11A is an image taken of the as-plated CuSe film from FIG. 10C according to an embodiment of the present invention;

FIG. 11B is an image taken of the as-plated CuSe film from FIG. 10B annealed for 1 hour according to an embodiment of the present invention;

DETAILED DESCRIPTION OF PREFERRED EMBODIMENTS

Figure 4:
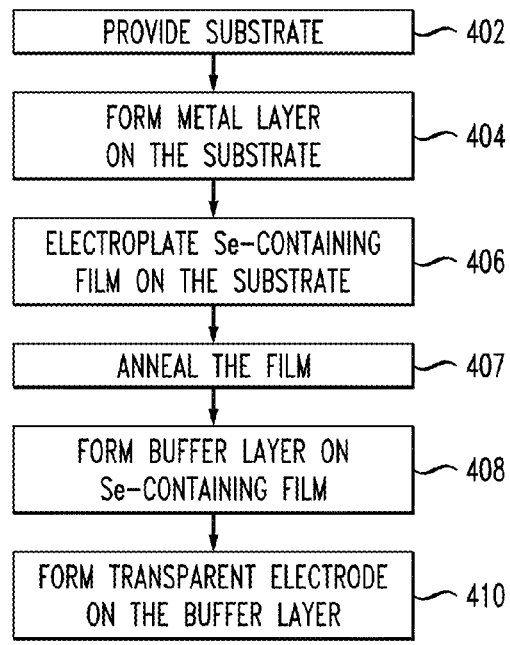
FIG. 4 is a diagram illustrating an exemplary methodology for fabricating a photovoltaic device according to an embodiment of the present invention.

Provided herein are techniques that remedy the above-described problems associated with electrodepositing selenium (Se) films. The terms "electrodeposition" and "electroplating" are being used interchangeably herein. FIG. 1, for example, is a diagram illustrating an exemplary methodology 100 for preparing a Se electroplating solution. In step 102, the solution is formed from a mixture of selenium oxide, a sulfonic acid or perchloric acid ($HClO_4$) and a solvent.

Any form of selenium oxide may be used. According to an exemplary embodiment, the selenium oxide is selenium dioxide ($SeO_2$). Suitable sulfonic acids include, but are not limited to, alkane sulfonic acid (e.g., methane sulfonic acid (MSA)), alkene sulfonic acid, aryl sulfonic acid, heterocyclic sulfonic acid and aromatic sulfonic acid.

While either a sulfonic acid or $HClO_4$ may be used in the electroplating solution, the sulfonic acid tends to perform better, see below. With all other acids tested, only a powdery deposit is obtained during plating. The powdery deposit is non-adherent to its substrate and easily washes away during rinsing. According to an exemplary embodiment, the solution contains from about 0.01 molar (M) to about 1M Se in from about 0.05M to about 1M acid (sulfonic acid or $HClO_4$), e.g., from about 0.1M to about 0.5M Se in from about 0.1M to about 0.6M acid (sulfonic acid or $HClO_4$). Suitable solvents include, but are not limited to, one or more of water, glycerol and an ionic liquid. Advantageously, the electroplating solution does not contain any complexing agents. Complexing agents introduce impurities into the deposited film. Furthermore, complexing agents oxidize and are difficult to maintain in the plating bath.

At this point, the solution will have a pH of about 0. In step 104, the pH of the solution is adjusted with a base, such as sodium hydroxide (NaOH), to from about 2.0 to about 3.0.

Optionally, in step 106, one or more additives may be added to the solution. These additives can include one or more organic additives, one or more metalloid halides and/or one or more sources of $Cl^-$ ions. Suitable organic additives include those having at least one nitrogen atom and at least one sulfur atom, such as thiourea or thiazine, or benzenesulfonic acid (BSA). The organic additive serves to aid in grain refinement, and to provide more smooth and uniform plating. According to an exemplary embodiment, the organic additive is present in the solution at a concentration of from about 1 parts per million (ppm) to about 10,000 ppm.

Suitable metalloid halides include, but are not limited to, bismuth chloride ($BiCl_3$). Suitable sources of $Cl^-$ ions include, but are not limited to, potassium chloride (KCl)

and/or sodium chloride (NaCl). The metalloid halide and/or Cl⁻ ion source additives advantageously help to produce a brighter deposit and help to refine the grains/morphology of the film.

Use of the solution as described above will result in the plating of a film containing Se only. However, the present techniques are also applicable to the plating of Se alloy films. By way of example only, in step 108, one or more metal salts such as a copper (Cu) salt (e.g., copper sulfate ($CuSO_4$), copper chlorite ($Cu(ClO_2)_2$) and/or copper nitrate ($Cu(NO_3)_2$), a zinc (Zn) salt (e.g., zinc sulfate ($ZnSO_4$), zinc chlorite ($ZnClO_4$) and/or zinc nitrate ($Zn(NO_3)_2$), an indium (In) salt (e.g., indium sulfate ($InSO_4$), indium chlorite ($In(ClO_2)_3$) and/or indium nitrate ($In(NO_3)_3$), a gallium (Ga) salt (e.g., gallium sulfate ($GaSO_4$), gallium chlorite ($GaClO_4$) and/or gallium nitrate ($GaN_3O_9$) and/or a tin (Sn) salt (e.g., tin sulfate ($SnSO_4$), tin chlorite ($SnClO_3)_2$ and/or tin nitrate ($Sn(NO_3)_2$) are optionally added to the solution in order to produce a corresponding Se alloy-containing film, e.g., copper-selenium (CuSe) and zinc-selenium (ZnSe). ZnSe, for example, is a good n-type buffer material that may be used in the fabrication of a photovoltaic device, as described below.

The metal salts can be used in combination. By way of example only, to produce a Se/Sn/Cu/Zn-containing film, such as $Cu_2ZnSn(S/Se)_4$ (CZTS), a combination of any one of the above-listed Sn salts, Cu salts and Zn salts can be added to the solution, each at a concentration of from about 0.1M to about 0.5M, in order to plate CZTS. To produce a Cu/In/Se- or Cu/In/Ga/Se-containing film, such as copper indium selenide (CIS) or copper indium gallium selenide (GIGS), respectively, a combination of any one of the above-listed Cu salts and In salts (and Ga salts for CIGS) can be added to the solution, each at a concentration of from about 0.1M to about 0.5M, in order to plate CIS or CIGS.

According to an exemplary embodiment, one liter (L) of the solution is prepared by placing from about 200 milliliters (ml) to about 400 ml of de-ionized water in a flask. $SeO_2$ at a concentration of from about 0.1M to about 1.0M is then added to the flask. 0.5M MSA or $HClO_4$ is then added to the flask. After stirring the $SeO_2$ dissolves and the solution becomes colorless.

If electrodeposition of an elemental Se layer is desired, then additional de-ionized water is added to the flask to bring the total volume to 1 L (pH of from about 0.1 to about 0.5). The solution is then ready for electroplating. On the other hand, if electrodeposition of Se in combination with a metal, such as copper selenium (CuSe) or zinc selenium (ZnSe) is desired, then the corresponding metal salt is first added to the solution. For example, to prepare a CuSe electroplating solution, Cu salt is added to the flask (millimole (mM) to M concentration). For plating a Se rich CuSe film, a mM amount of Cu salt is required in the solution. For plating a Se poor CuSe film, a M amount of Cu salt is required in the solution. Additional de-ionized water is then added to the flask to bring the total volume to 1 L.

To prepare a ZnSe electroplating solution, for example, Zn salt is added to the flask (mM to M concentration). For plating a Se rich ZnSe film, a mM amount of Zn salt is required in the solution. For plating a Se poor ZnSe film, a M amount of Zn salt is required in the solution. Additional de-ionized water is then added to the flask to bring the total volume to 1 L.

The solution may then be used as a plating bath to electroplate a Se-containing film on a substrate. FIG. 2 is a diagram illustrating exemplary methodology 200 for forming a Se-containing film. The film may include Se alone, or in combination with one or more metals, such as Cu, Zn, In, Ga and Sn. Advantageously, the present techniques can be employed to fabricate copper indium selenide (CIS), copper indium gallium selenide (CIGS) and copper zinc tin sulfide/selenide (CZTS) materials for use, e.g., in photovoltaic devices. See below.

In step 202, a Se electroplating solution is prepared. The process for preparing the Se electroplating solution was described in conjunction with the description of FIG. 1, above, and that description is incorporated by reference herein.

In step 204, a substrate is provided. The substrate can be any substrate on which the deposition of a Se-containing film is desired. According to an exemplary embodiment, the present techniques are employed in the formation of a Se-containing absorber layer for a photovoltaic device. In that instance (as will be described in detail below), the substrate can be the photovoltaic device substrate (e.g., a molybdenum (Mo)-coated glass substrate).

In step 206, electroplating is then used to form a Se-containing film on the substrate using the solution as the plating bath. During the electroplating process, the substrate is placed directly in the bath. Electroplating techniques, parameters and an exemplary electroplating cell which are suitable for use with the present electroplating solutions are described, for example, in U.S. patent application Ser. No. 12/878,746, entitled "Structure and Method of Fabricating a CZTS Photovoltaic Device by Electrodeposition" (hereinafter "U.S. patent application Ser. No. 12/878,746"), now U.S. Pat. No. 8,426,241, the contents of which are incorporated by reference herein. Of course, the exact composition of the film produced will depend on the composition of the electroplating solution. As described above, the electroplating solution may contain Se, either alone, or in combination with one or more metal salts. For instance, when the electroplating solution includes both Cu and Zn metal salts, then the film produced will contain an alloy of Se, Cu and Zn. As described below, the resultant films are Se rich.

According to an exemplary embodiment, the electroplating is carried out at room temperature, i.e., from about 18 degrees Celsius (° C.) to about 24° C. The duration of the plating can be tailored to the desired thickness of the film (see below).

Optionally, in step 208, the film is then annealed. This anneal is optional based on the intended use of the film. By way of example only, when the film is being used in the production of a photovoltaic device absorber layer conductivity is important. As-plated Se is amorphous and exhibits poor conductivity, which can be remedied by the anneal. Accordingly, in this instance the annealing step would be favorable to convert the film into a crystalline, conductive layer. According to an exemplary embodiment, the film is annealed at a temperature of from about 100° C. to about 300° C., e.g., about 150° C., for a duration of from about 30 minutes to about 60 minutes.

One notable advantage of the present techniques is that the electroplating process and Se electroplating solutions described herein can be used to form Se alloy films (e.g., CIS, CIGS, CZTS) that can serve as the absorber layer in photovoltaic devices. An exemplary photovoltaic device and method for the fabrication thereof will now be described. It is to be understood however that there are many different possible photovoltaic device configurations, and the particular configuration described below is provided merely to illustrate the present techniques.

FIG. 3 is a diagram illustrating exemplary photovoltaic device 300. Photovoltaic device 300 includes a substrate 302, p-type absorber layer 304 adjacent to substrate 302, n-type buffer layer 306 adjacent to a side of absorber layer 304 opposite substrate 302 and transparent electrode 308 adjacent to a side of buffer layer 306 opposite absorber layer 304. According to an exemplary embodiment, substrate 302 includes a glass, metal or plastic substrate 302a that is coated with a material 302b such as Mo. A metal layer 303 (e.g., a Cu layer) may be present in between substrate 302 and absorber layer 304. A conductor layer is needed in order to electroplate the absorber layer on the substrate (see, for example, FIG. 4, described below). In this example, metal layer 303 serves this purpose. Further, metal layer 303 prevents the undesirable oxidation of the Mo. Metal layer 303 can serve as a bottom electrode for the device.

In this example, absorber layer 304 is an Se-containing p-type absorber material (e.g., CIS, CIGS or CZTS) formed using the present techniques, e.g., wherein the plating bath contains Se in combination with the appropriate metal salts, as described above. The process for forming the absorber layer is described further below.

Buffer layer 306 includes an n-type material such as cadmium sulfide (CdS) or ZnSe. Like with the absorber layer materials, ZnSe can be plated using the present Se electroplating solution with the addition of a Zn metal salt. See below. Transparent electrode 308 can include materials, such as aluminum (Al) or n-doped zinc oxide (ZnO) or indium-tin-oxide (ITO) and intrinsic ZnO.

FIG. 4 is a diagram illustrating exemplary methodology 400 for fabricating a photovoltaic device, such as photovoltaic device 300 (of FIG. 3). In step 402, a substrate is provided. According to an exemplary embodiment, the substrate is a glass substrate coated with Mo. In step 404, a metal layer is formed on the substrate, i.e., on the Mo-coated surface of the glass substrate. As described above, the metal layer serves as a conductive layer for electroplating and prevents oxidation of the Mo. The metal layer will serve as a bottom electrode of the device. According to an exemplary embodiment, the metal layer includes Cu and is formed using sputtering to a thickness of from about 10 nanometers (nm) to about 100 nm.

In step 406, a p-type absorber layer is formed adjacent to the substrate. Namely, the substrate (with the metal layer) is placed directly into a plating bath solution prepared as described, for example, in conjunction with the description of FIG. 1, above. In this case, the electroplating solution, in addition to Se, contains one or more metal salts. The particular metal salt(s) used depends on the desired composition of the absorber layer. By way of example only, the electroplating solution would contain a Cu salt and an In salt if a CIS absorber layer is desired. The further addition of a Ga salt would result in a CIGS absorber layer. A Cu salt, a Zn salt and a Sn salt would be employed for a CZTS absorber layer. Suitable Cu, In, Ga, Zn and Sn salts were provided above. Electroplating is then used to form the absorber layer (e.g., CIS, CIGS, CZTS) on the substrate over the metal layer. The plating time can be tailored to the desired thickness of the resultant absorber layer, with a longer plating time being used to attain a thicker layer. According to an exemplary embodiment, the absorber layer is formed on the substrate to a thickness of from about 1 nm to about 1 micrometer (μm).

The absorber layer produced in this manner will be an alloy of Se and the appropriate metal(s). It is also possible to plate a plurality of layers, each layer containing one or more components of the absorber layer, and then anneal the layers to intersperse the components and form the absorber layer. This technique is described in U.S. patent application Ser. No. 12/878,746. To do so may require plating layers such as Cu-containing and Zn-containing layers. Techniques for preparing a Zn plating solution for electrodepositing a Zn-containing metal layer, for example, are described in U.S. patent application Ser. No. 12/878,787, entitled "Zinc Thin Films Plating Chemistry and Methods," the contents of which are incorporated by reference herein.

As highlighted above, it is advantageous to employ an anneal, for example, at a temperature of from about 100° C. to about 300° C., e.g., about 150° C., for a duration of from about 30 minutes to about 60 minutes, to convert the electrodeposited Se film into a crystalline, conductive layer. This anneal is performed in step 407.

The present method, as compared to conventional evaporation or sputtering, will be cheapest, allow a high rate of deposition as well as improve the adhesion of the absorber layer to its back contact materials. When a CIS, CIGS or CZTS material is fabricated by the deposition of a stack of metal thin films such as a stack of Cu, In and Ga metal films or a stack of Cu, Zn and Sn metal films there is a high volume expansion during subsequent selenization (the process by which Se is introduced into the stack), which can lead to poor adhesion (and possibly delamination) of the absorber layer from the back contact material. Advantageously, the present techniques permit plating of Se thus avoiding the need for selenization, and the problems associated therewith. Advantageously, the present technique permits the Se to be deposited as an interlayer in the stack (as opposed to being introduced during selenization) which altogether avoids the problem of large volume expansion and loss of adhesion of the chalcopyrite material. Evaporation and/or sputtering, aside from the high cost, also have poor selectivity. Electrodeposition has 100% selectivity and is a low cost method of deposition utilizing solutions.

In step 408, an n-type buffer layer is formed adjacent to a side of the absorber layer opposite the substrate. According to an exemplary embodiment, the buffer layer includes CdS and is deposited onto the absorber layer using chemical bath deposition or a spray technique. Alternatively, the buffer layer can include ZnSe and can be electrodeposited using the present Se electroplating solution as a plating bath. The electroplating solution in this case would contain Se and one of the aforementioned Zn salts. Thus, the substrate can be placed in a first one of the present Se electroplating solutions (containing Se in combination with the appropriate metal salt(s) for the absorber layer) to plate the absorber layer (step 406). Once the absorber layer is plated, the structure can be removed from the first bath, annealed (step 407), and then placed in a second one of the present Se electroplating solutions (containing Se in combination with a Zn salt) to plate the buffer layer. With whichever buffer layer material/deposition technique is employed, the absorber layer is formed having a thickness of, e.g., from about 20 nm to about 40 nm. Since the buffer layer contains an n-type material, the buffer layer will form a p-n junction with the p-type absorber layer.

In step 410, a transparent electrode is formed on the buffer layer (adjacent to a side of the buffer layer opposite the absorber layer). According to an exemplary embodiment, the transparent electrode includes Al or n-doped ZnO or a combination of ITO and intrinsic ZnO and is deposited onto the buffer layer using a sputtering technique to a thickness of from about 250 nm to about 350 nm.

Figure 5:
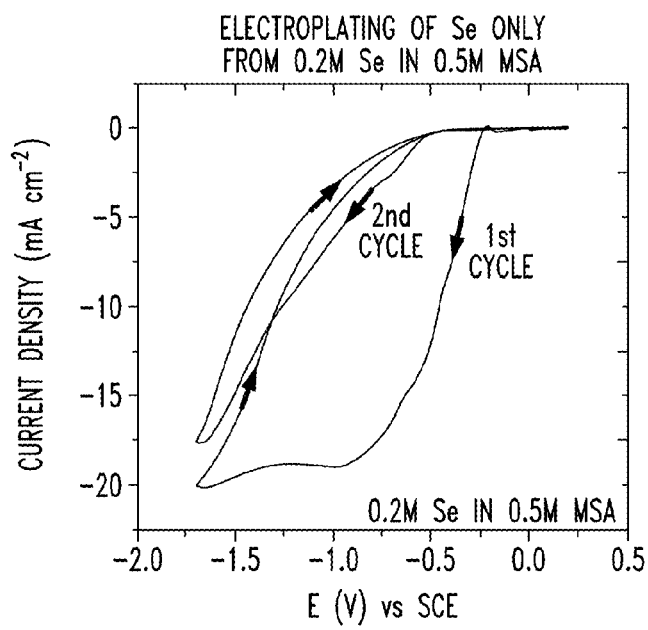
FIG. 5 is a graph illustrating plating properties of an exemplary Se only film produced using the present techniques according to an embodiment of the present invention.

The present techniques are further described by way of reference to the following non-limiting examples. FIG. 5 is a graph 500 illustrating plating properties of an exemplary Se only film produced using the present techniques. The electroplating solution in this example contained 0.2M Se in 0.5M MSA. A standard pulse-reverse electroplating process was employed. In graph 500, electrode voltage (E) (measured in volts (V)) vs. saturated calomel reference electrode (SCE) is plotted on the x-axis and current density (measured in milliamps per square centimeter (mAcm$^{-2}$) is plotted on the y-axis. The current density in the second cycle is low due to the resistive nature of the deposited Se films. The surface of electroplated Se thin films becomes oxidized during the reverse cycle when the electrode is subjected to the more positive voltage and thus the film became resistive and hence during the second cycle low current density was observed.

FIGS. 6A-D are x-ray diffraction (xrd) spectra 600A-D for an exemplary Se only film produced using the present techniques: after an anneal of the film for 7 hours at 100° C., after an anneal of the film for 1 hour at 100° C., the film as-plated and for a substrate (onto which the film was plated), respectively. In each spectra, beam angle (2θ) is plotted on the x-axis and intensity (measured in atomic units (a.u.)) is plotted on the y-axis. The electroplating solution in this example contained 0.2M Se in 0.5M MSA. Current density (J)=10 mAcm$^{-2}$ and plating time (t)=60 seconds. No noticeable change was observed in the xrd spectrum after the 7 hour annealing. The substrate in this example was a Mo-coated glass substrate with a metal (e.g., Cu) layer on top (see description above).

Figure 6A:
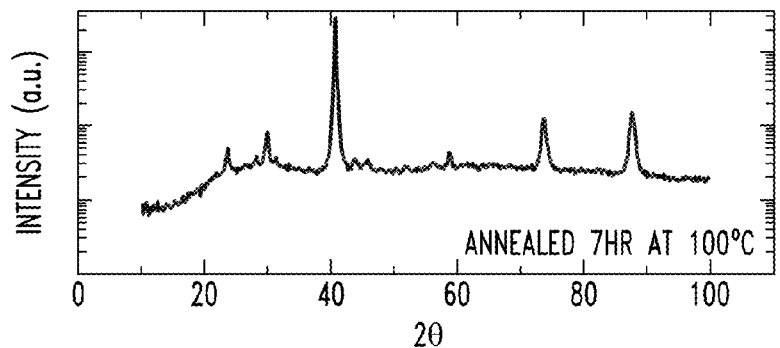
FIG. 6A is an x-ray diffraction (xrd) spectrum for an exemplary Se only film, produced using the present techniques, after an anneal for 7 hours according to an embodiment of the present invention.
Figure 6B:
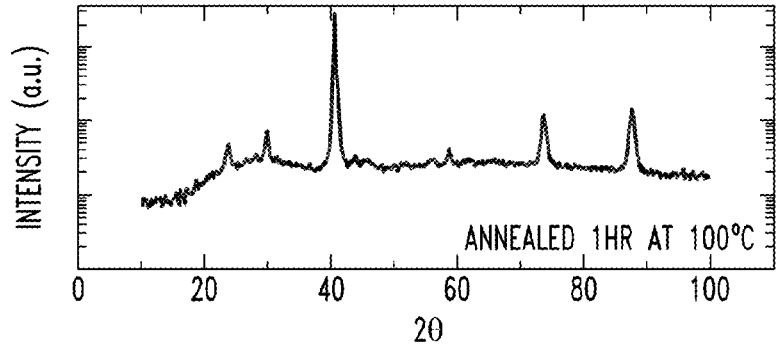
FIG. 6B is an xrd spectrum for an exemplary Se only film, produced using the present techniques, after an anneal for 1 hour according to an embodiment of the present invention.
Figure 6C:
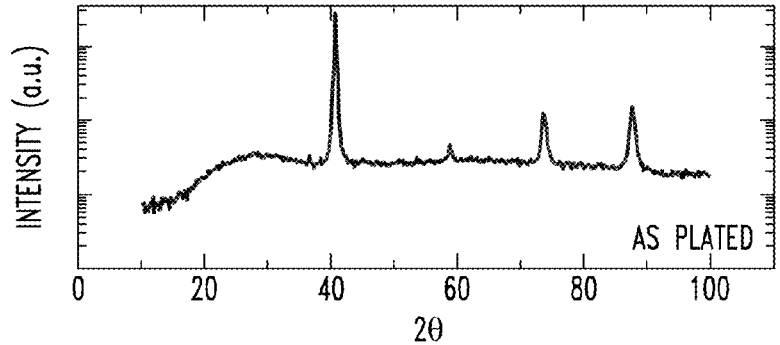
FIG. 6C is an xrd spectrum for an exemplary Se only film, produced using the present techniques, as-plated (without anneal) according to an embodiment of the present invention.
Figure 6D:
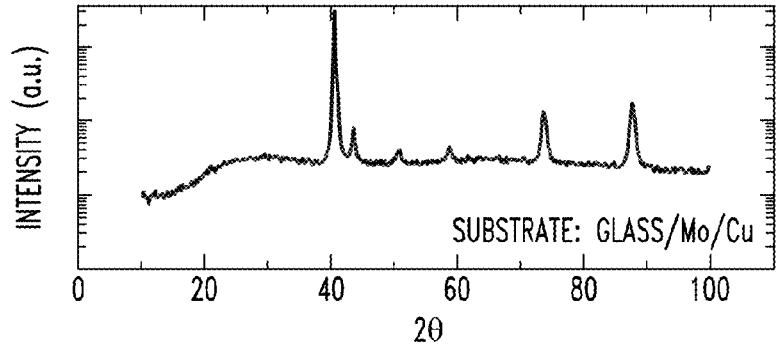
FIG. 6D is an xrd spectrum for a substrate onto which the films of FIGS. 6A-C are plated according to an embodiment of the present invention.
Figure 7A:
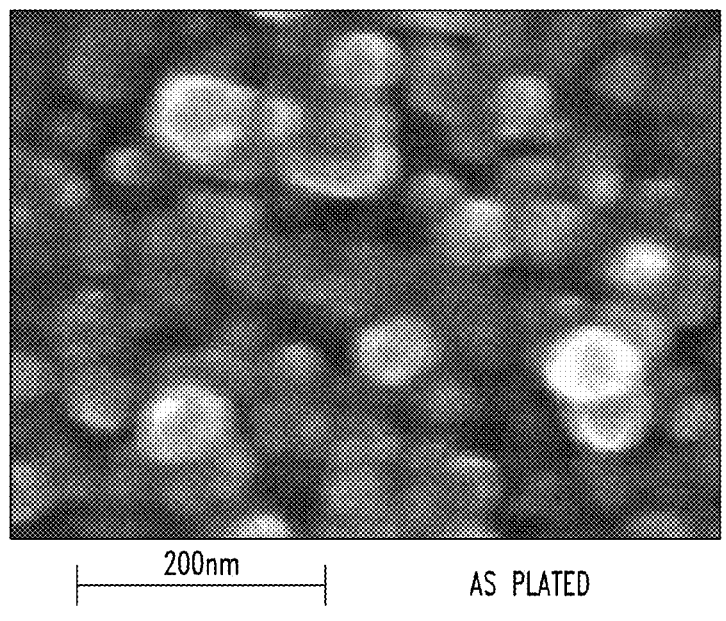
FIG. 7A is an image taken of the as-plated Se film of FIG. 6C according to an embodiment of the present invention.
Figure 7B:
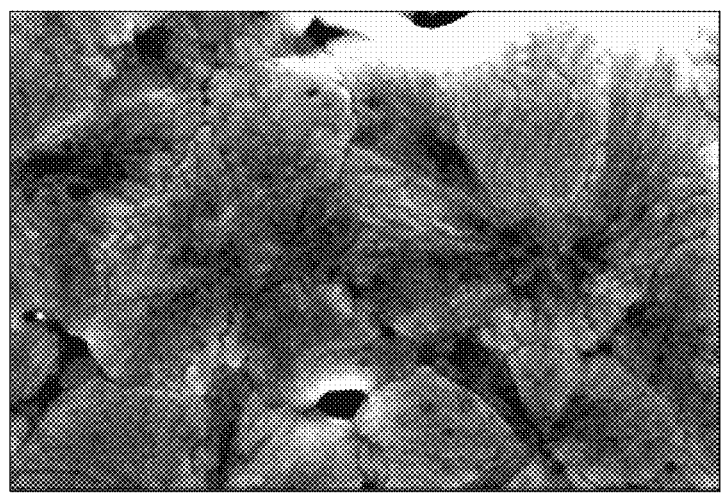
FIG. 7B is an image taken of the Se film of FIG. 6B annealed for 1 hour according to an embodiment of the present invention.

FIGS. 7A and 7B are images 700A and 700B taken of the Se film from FIGS. 6A-C (see above) as-plated and after the anneal at 100° C. for 1 hour, respectively. By comparison with image 700A, image 700B shows large grain growth after annealing.

Figure 8:
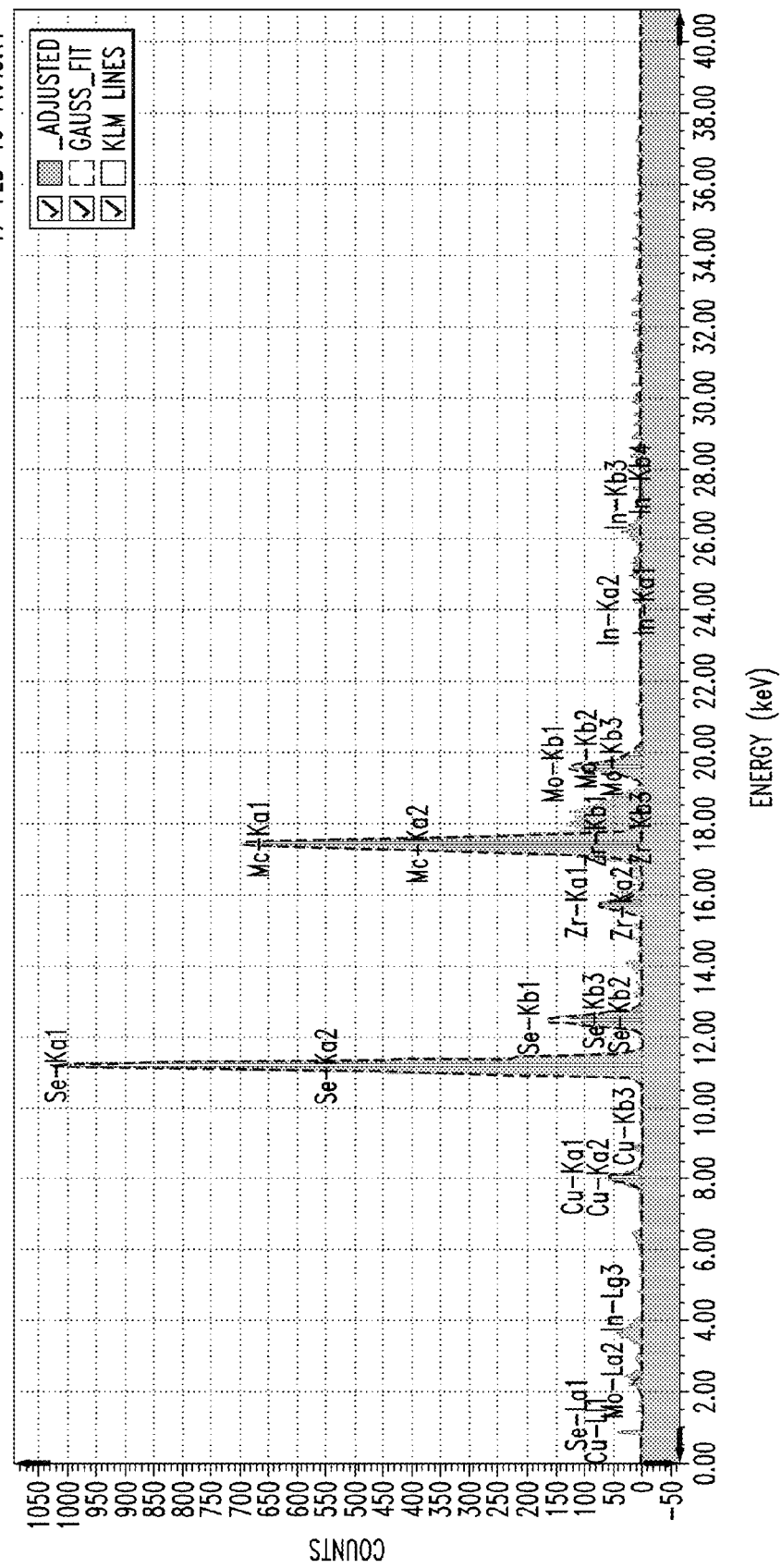
FIG. 8 is an x-ray fluorescence (xrf) spectrum for an exemplary Se only film produced using the present techniques according to an embodiment of the present invention.

FIG. 8 is an x-ray fluorescence (xrf) spectrum 800 for an exemplary Se only film produced using the present techniques. In the spectrum, energy (measured in kiloelectron volts (keV)) is plotted on the x-axis and counts are plotted on the y-axis. The electroplating solution in this example contained 0.2M Se in 0.5M MSA. Current density (J)=10 mAcm$^{-2}$ and plating time (t)=60 seconds. The substrate in this example was a Mo-coated glass substrate with a metal (e.g., Cu) layer on top (see description above). There was no Cu in the plating solution. Therefore the low intensity Cu peak is due to the substrate.

Figure 9:
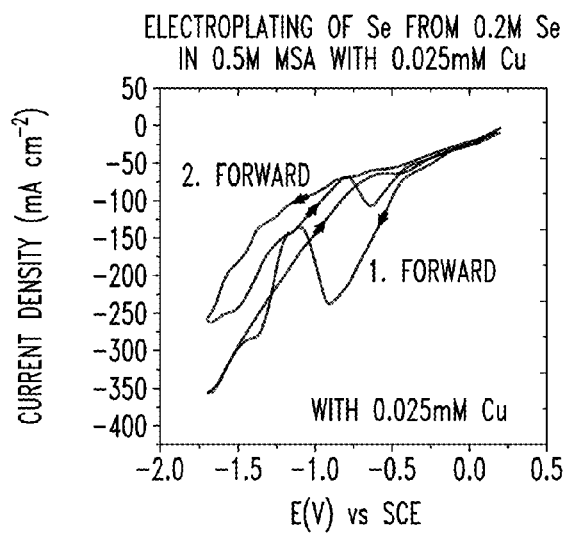
FIG. 9 is a graph illustrating plating properties of an exemplary copper-selenium (CuSe) alloy-containing film produced using the present techniques according to an embodiment of the present invention.

Next, Se alloy films were produced. FIG. 9 is a graph 900 illustrating plating properties of an exemplary CuSe alloy-containing film produced using the present techniques. The electroplating solution in this example contained 0.2M Se in 0.5M MSA with 0.025 millimolar (mM) Cu. A standard pulse-reverse electroplating process was employed. In graph 900, electrode voltage (E) (measured in V) vs. SCE is plotted on the x-axis and current density (measured in mAcm$^{-2}$) is plotted on the y-axis.

FIGS. 10A-D are xrd spectra 1000A-D for an exemplary CuSe alloy-containing film produced using the present techniques: after an anneal of the film for 7 hours at 100° C., after an anneal of the film for 1 hour at 100° C., the film as-plated and for a substrate (onto which the film was plated), respectively. In each spectra, beam angle (2θ) is plotted on the x-axis and intensity (measured in a.u.) is plotted on the y-axis. The electroplating solution in this example contained 0.2M Se in 0.5M MSA with 0.025 mM Cu. No noticeable change was observed in the xrd spectrum after the 7 hour annealing. The substrate in this example was a Mo-coated glass substrate with a metal (e.g., Cu) layer on top (see description above).

Figure 10A:
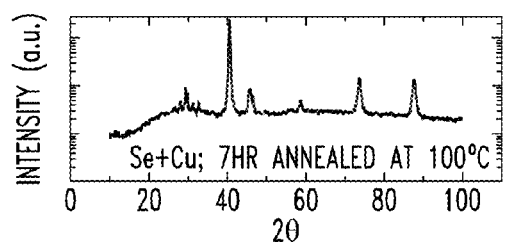
FIG. 10A is an xrd spectrum for an exemplary CuSe alloy-containing film, produced using the present techniques, after an anneal for 7 hours according to an embodiment of the present invention.
Figure 10B:
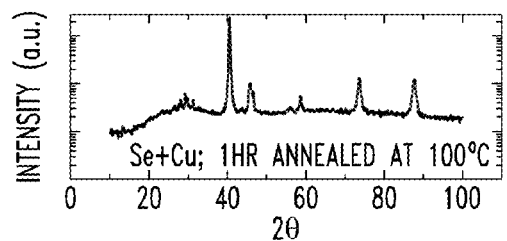
FIG. 10B is an xrd spectrum for an exemplary CuSe alloy-containing film, produced using the present techniques, after an anneal for 1 hour according to an embodiment of the present invention.
Figure 10C:
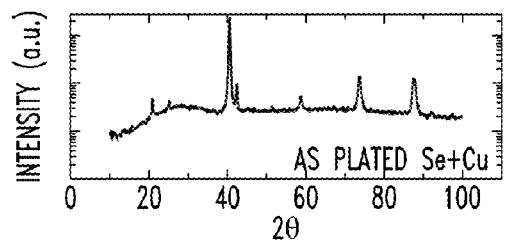
FIG. 10C is an xrd spectrum for an exemplary CuSe alloy-containing film, produced using the present techniques, as-plated (without anneal) according to an embodiment of the present invention.
Figure 10D:
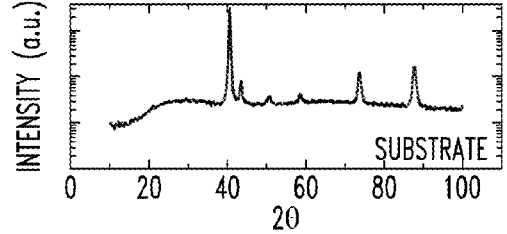
FIG. 10D is an xrd spectrum for a substrate onto which the films of FIGS. 10A-C are plated according to an embodiment of the present invention.

FIGS. 11A and 11B are images 1100A and 1100B taken of the Se/Cu film from FIGS. 10A-C (see above) as-plated and after the anneal at 100° C. for 1 hour, respectively. By comparison with image 1100A, image 1100B shows large grain growth after annealing.

Figure 12:
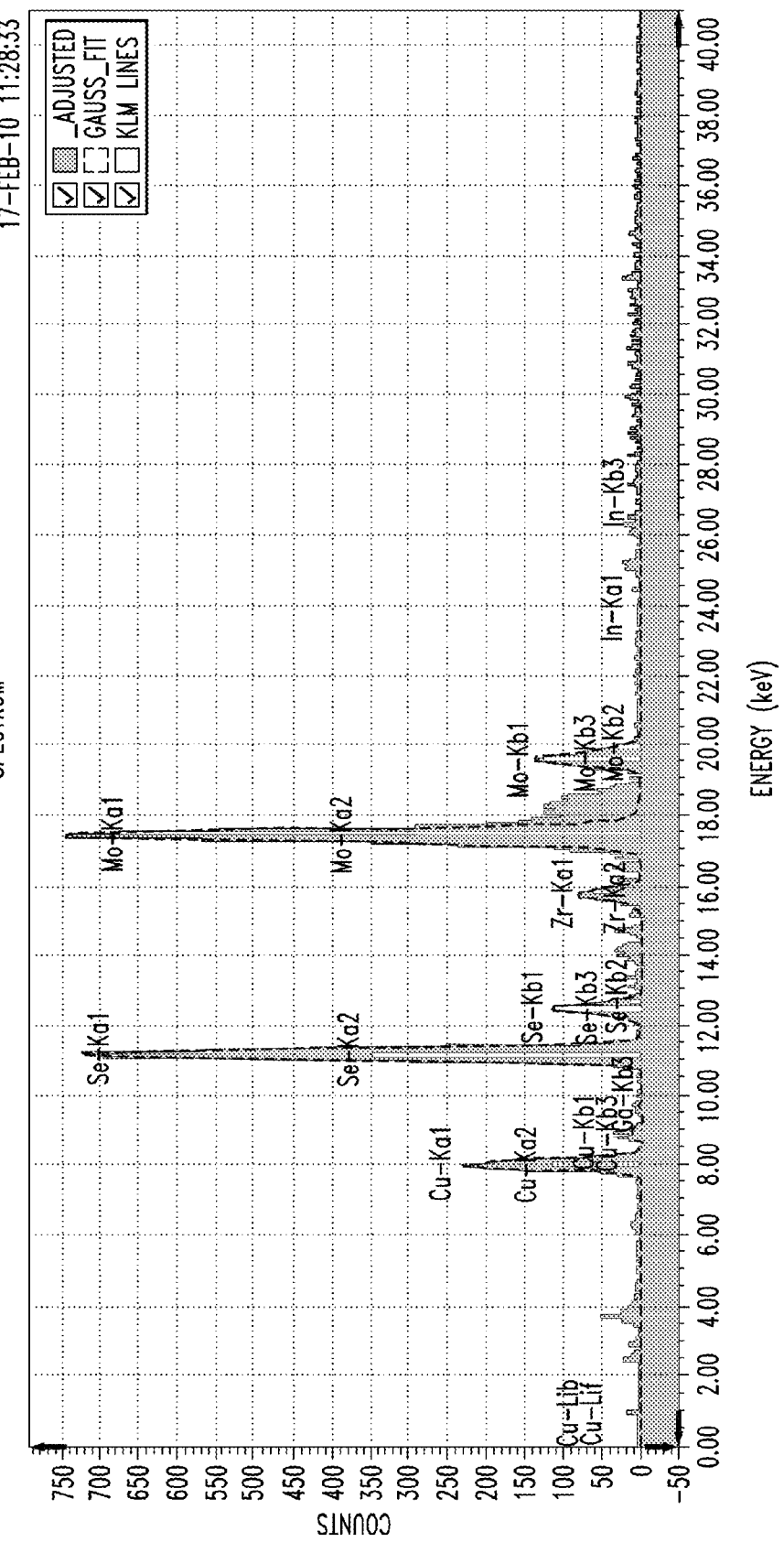
FIG. 12 is an xrf spectrum for an exemplary CuSe alloy-containing film produced using the present techniques according to an embodiment of the present invention.
Figure 13A:
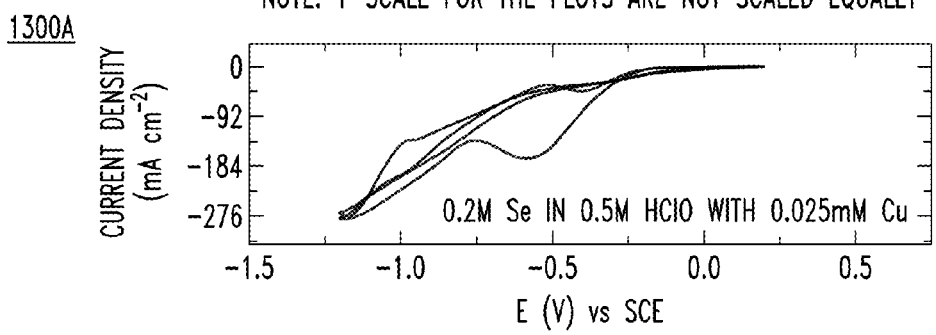
FIG. 13A is a graph illustrating plating properties of an exemplary CuSe film produced using the present techniques, wherein the acid in the plating solution is perchloric acid ($HClO_4$) according to an embodiment of the present invention.
Figure 13B:
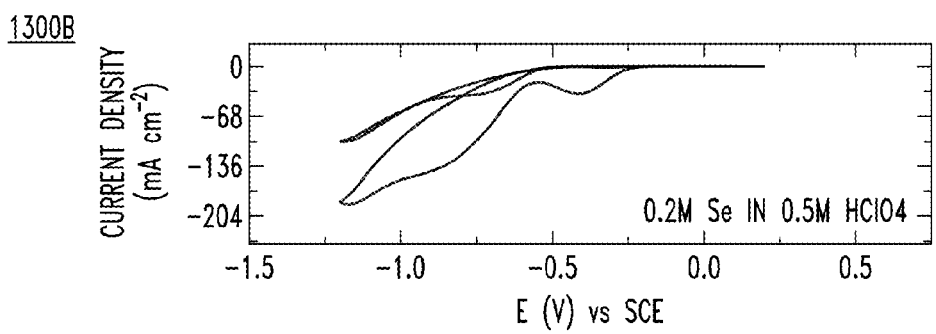
FIG. 13B is a graph illustrating plating properties of an exemplary Se film produced using the present techniques, wherein the acid in the plating solution is $HClO_4$ according to an embodiment of the present invention.
Figure 13C:
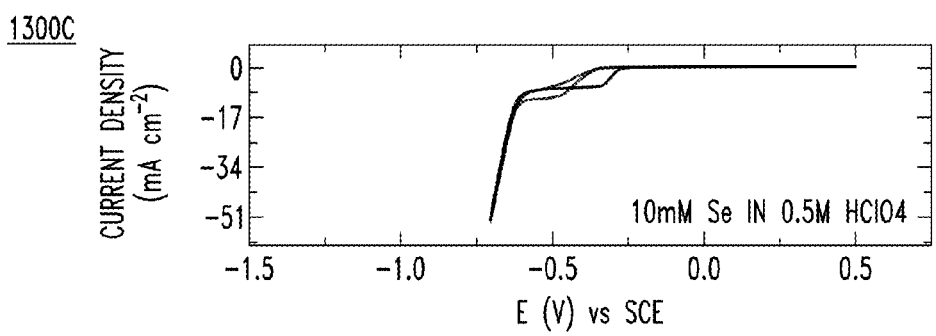
FIG. 13C is a graph illustrating plating properties of an exemplary Se film produced using the present techniques, wherein the acid in the plating solution is $HClO_4$ and wherein a concentration of the Se used in the solution is varied according to an embodiment of the present invention.
Figure 13D:
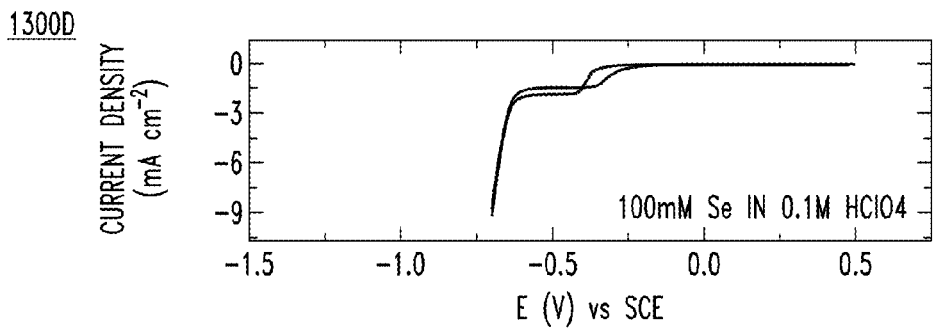
FIG. 13D is a graph illustrating plating properties of an exemplary Se film produced using the present techniques, wherein the acid in the plating solution is $HClO_4$ and wherein a concentration of both the Se and the acid used in the solution are varied according to an embodiment of the present invention.

FIG. 12 is an xrf spectrum 1200 for an exemplary CuSe alloy-containing film produced using the present techniques. In the spectrum, energy (measured in keV) is plotted on the x-axis and counts are plotted on the y-axis. The electroplating solution in this example contained 0.2M Se in 0.5M MSA and 0.025 mM Cu. Current density (J)=10 mAcm$^{-2}$ and plating time (t)=60 seconds. The solution contained Cu$^{2+}$ in a low concentration and the alloy was still Se rich.

Next, HClO$_4$ (instead of MSA) was used in the plating solution. FIGS. 13A-D are graphs 1300A-D, respectively, illustrating plating properties of exemplary films produced using the present techniques, wherein the acid in the plating solution is HClO$_4$. Specifically, in a first sample, the electroplating solution contained 0.2M Se in 0.5M HClO$_4$ with 0.025 mM Cu (see graph 1300A). In the second sample, the electroplating solution contained 0.2M Se in 0.5M HClO$_4$ (see graph 1300B). In the third sample, the electroplating solution contained 10 mM Se in 0.5M HClO$_4$ (see graph 1300C). In the fourth sample, the electroplating solution contained 10 mM Se in 0.1M HClO$_4$ (see graph 1300D). A standard pulse-reverse electroplating process was employed. In each graph 1300A-D, electrode voltage (E) (measured in V) vs. SCE is plotted on the x-axis and current density (measured in mAcm$^{-2}$) is plotted on the y-axis. It is notable that the y-scale for the graphs are not scaled equally.

FIGS. 14A-D are x-ray diffraction (xrd) spectra 1400A-D for an exemplary CuSe alloy-containing film produced using the present techniques, wherein the electroplating bath contains HClO$_4$: after an anneal of the film for 7 hours at 100° C., after an anneal of the film for 1 hour at 100° C., the film as-plated and for a substrate (onto which the film was plated), respectively. In each spectrum, beam angle (2θ) is plotted on the x-axis and intensity (measured in a.u.) is plotted on the y-axis. The electroplating solution in this example contained 0.2M Se in 0.5M HClO$_4$ with 0.025 mM Cu. The substrate in this example was a Mo-coated glass substrate with a metal (e.g., Cu) layer on top (see description above).

Figure 14A:
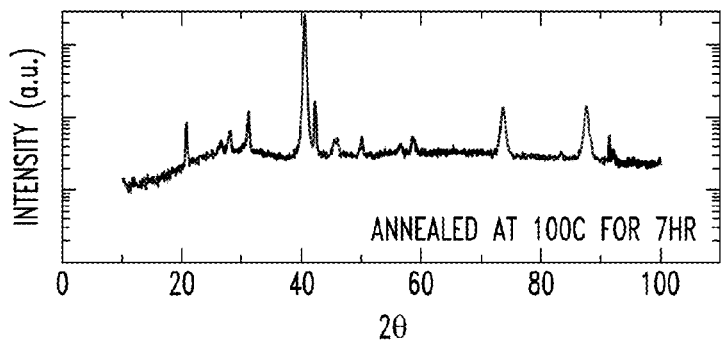
FIG. 14A is an xrd spectrum for an exemplary CuSe alloy-containing film, produced using the present techniques, wherein the electroplating bath contains $HClO_4$, after an anneal for 7 hours according to an embodiment of the present invention.
Figure 14B:
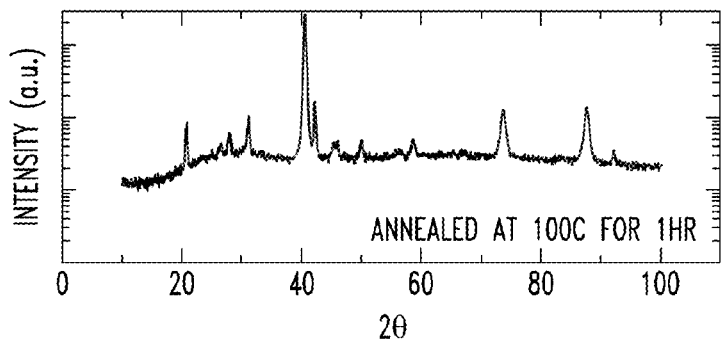
FIG. 14B is an xrd spectrum for an exemplary CuSe alloy-containing film, produced using the present techniques, wherein the electroplating bath contains $HClO_4$, after an anneal for 1 hour according to an embodiment of the present invention.
Figure 14C:
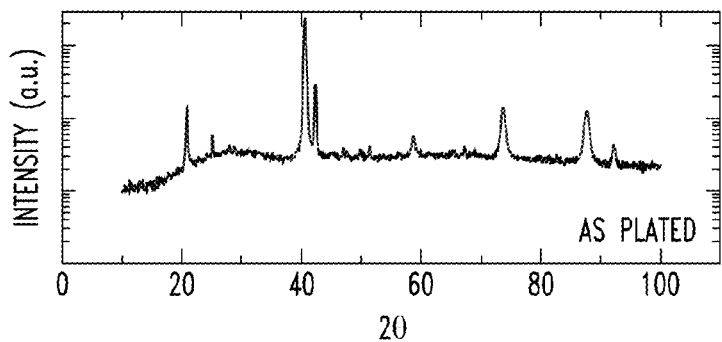
FIG. 14C is an xrd spectrum for an exemplary CuSe alloy-containing film, produced using the present techniques, wherein the electroplating bath contains $HClO_4$, as-plated (without anneal) according to an embodiment of the present invention.
Figure 14D:
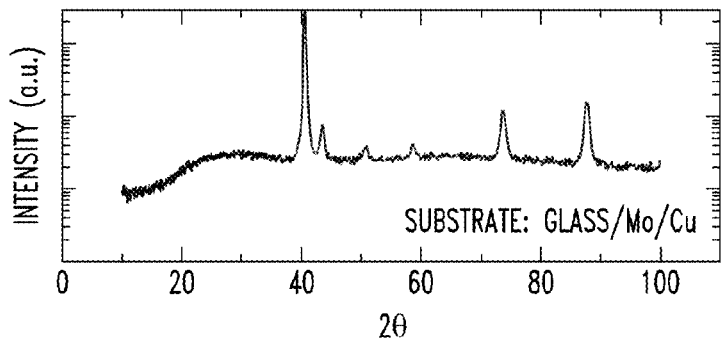
FIG. 14D is an xrd spectrum for a substrate onto which the films of FIGS. 14A-C are plated according to an embodiment of the present invention.
Figure 15A:
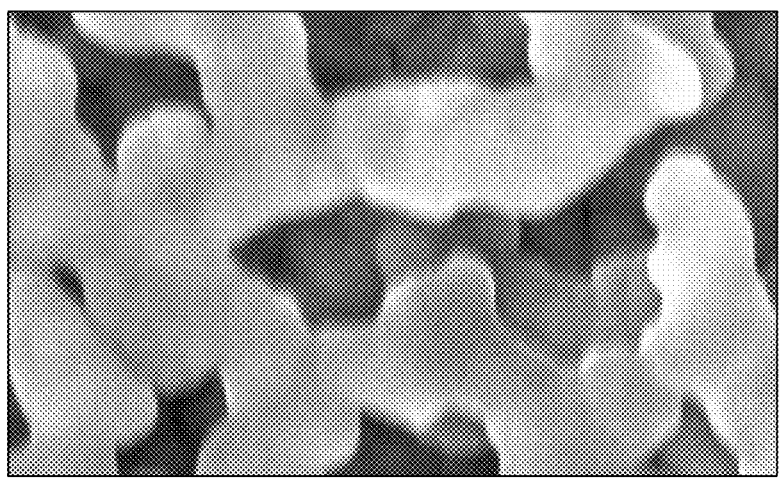
FIG. 15A is an image taken of the as-plated CuSe film from FIG. 14C according to an embodiment of the present invention.
Figure 15B:
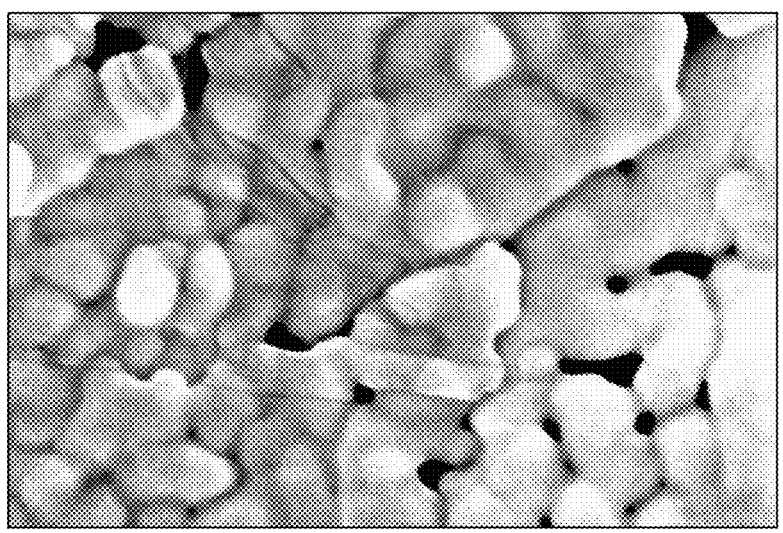
FIG. 15B is an image taken of the CuSe film from FIG. 14B annealed for 1 hour according to an embodiment of the present invention.

FIGS. 15A and 15B are images 1500A and 1500B taken of the Se/Cu film from FIGS. 14A-C (see above) as-plated and after the anneal at 100° C. for 1 hour, respectively. By comparison with image 1500A, image 1500B shows large grain growth after annealing.

Figure 16:
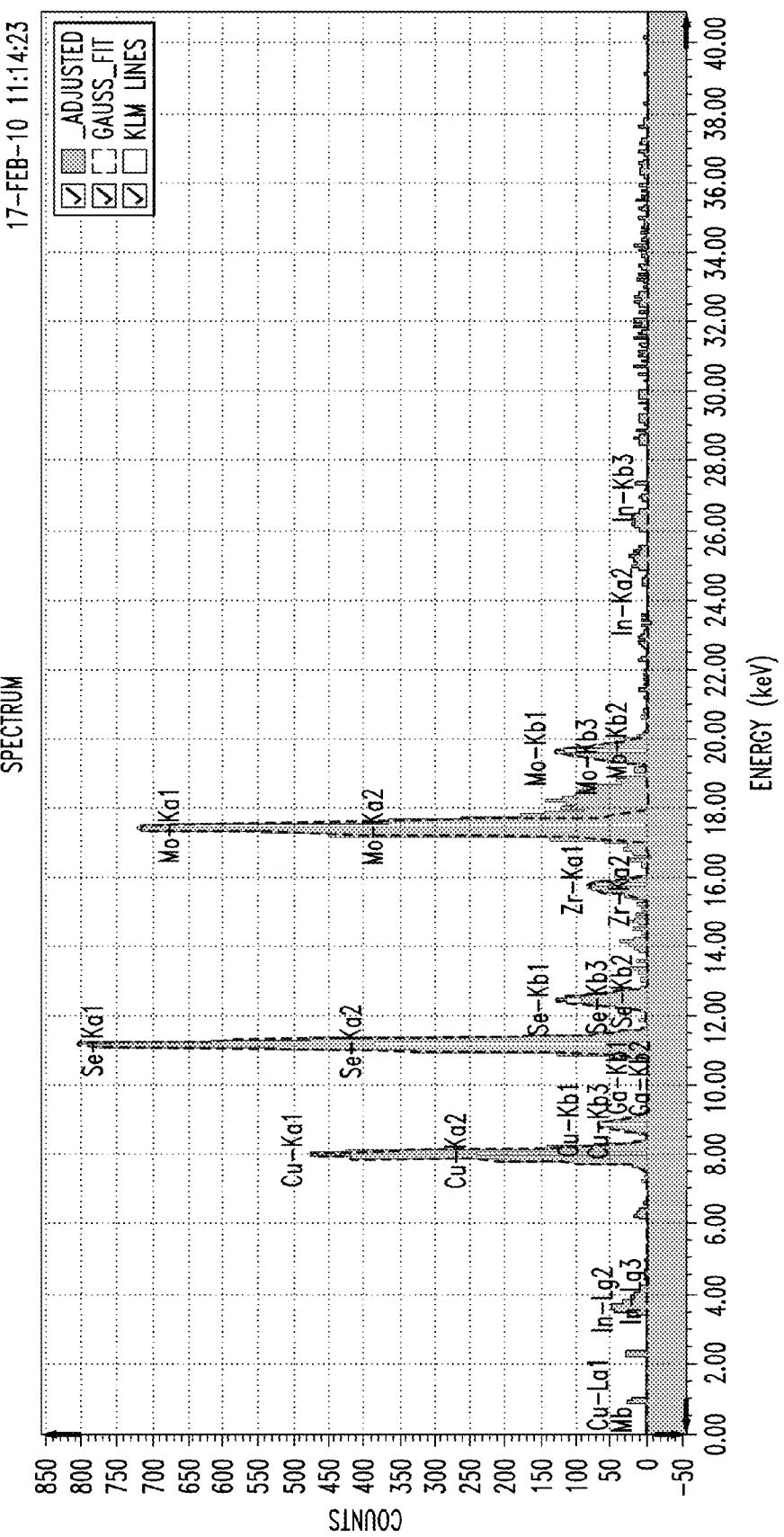
FIG. 16 is an xrf spectrum for an exemplary CuSe alloy-containing film produced using the present techniques, wherein the electroplating bath contains $HClO_4$, according to an embodiment of the present invention.

FIG. 16 is an xrf spectrum 1600 for an exemplary CuSe alloy-containing film produced using the present techniques, wherein the electroplating bath contains HClO$_4$. In the spectrum, energy (measured in keV) is plotted on the x-axis and counts are plotted on the y-axis. The electroplating solution in this example contained 0.2M Se in 0.5M HClO$_4$ and 0.025 mM Cu. Current density (J)=10 mAcm$^{-2}$ and plating time (t)=60 seconds. The solution contained Cu$^{2+}$ in a low concentration and the alloy was still Se rich.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of preparing a selenium electroplating solution, comprising the steps of:
   forming the solution from a mixture comprising:
      selenium oxide;
      an acid selected from the group consisting of alkane sulfonic acid, alkene sulfonic acid, aryl sulfonic acid, heterocyclic sulfonic acid, aromatic sulfonic acid and perchloric acid; and
      a solvent,
   wherein based on the selenium oxide, the acid, and the solvent, the solution has a pH of about 0; and after the forming step has been performed, adjusting the pH of the solution with a base to from about 2.0 to about 3.0; and after the pH of the solution has been adjusted with the base, adding one or more additives to the solution, wherein the solution is free of metals, and the selenium oxide is an only plating element present in the solution such that the solution is configured to plate an elemental selenium film wherein selenium in the film is present in a non-alloy form.

2. The method of claim 1, wherein the step of adjusting the pH of the solution comprises the step of:

adding the base to the solution, after the forming step has been performed, to adjust the pH of the solution to from about 2.0 to about 3.0.

3. The method of claim 2, wherein the base comprises sodium hydroxide.

4. The method of claim 1, wherein the acid is an alkane sulfonic acid, and wherein the alkane sulfonic acid is methanesulfonic acid.

5. The method of claim 4, wherein the selenium oxide is at a concentration of from about 0.01 M to about 1M and is dissolved in from about 0.05M to about 1M methanesulfonic acid.

6. The method of claim 4, wherein the selenium oxide is at a concentration of from about 0.1 M to about 0.5M and is dissolved in from about 0.1M to about 0.6M methanesulfonic acid.

7. The method of claim 1, wherein the selenium oxide comprises selenium dioxide.

8. The method of claim 1, wherein the step of adding the one or more additives to the solution comprises the step of:

after the pH of the solution has been adjusted with the base, adding at least one organic additive to the solution at a concentration of from about 1 part per million to about 10,000 parts per million.

9. The method of claim 8, wherein the at least one organic additive has one or more nitrogen atoms and one or more sulfur atoms.

10. The method of claim 9, wherein the at least one organic additive is selected from the group consisting of thiourea and thiazine.

11. The method of claim 1, wherein the step of adding the one or more additives to the solution comprises the step of:

after the pH of the solution has been adjusted with the base, adding at least one metalloid halide to the solution.

12. The method of claim 11, wherein the at least one metalloid halide comprises bismuth chloride.

13. The method of claim 1, wherein the solution is free of complexing agents.

14. A selenium electroplating solution, comprising:

selenium oxide;

an acid selected from the group consisting of alkane sulfonic acid, alkene sulfonic acid, aryl sulfonic acid, heterocyclic sulfonic acid, aromatic sulfonic acid and perchloric acid;

a solvent; and a base, wherein the selenium oxide, the acid, and the solvent together have a pH of about 0, and wherein the base is configured to adjust a pH of the solution to from about 2.0 to about 3.0, and wherein the solution is free of metals, and the selenium oxide is an only plating element present in the solution such that the solution is configured to plate an elemental selenium film wherein selenium in the film is present in a non-alloy form.

15. The selenium electroplating solution of claim 14, wherein the acid is an alkane sulfonic acid, and wherein the alkane sulfonic acid is methanesulfonic acid.

16. The selenium electroplating solution of claim 15, wherein the selenium oxide is at a concentration of from about 0.01 M to about 1M and is dissolved in from about 0.05M to about 1M methanesulfonic acid.

17. The selenium electroplating solution of claim 15, wherein the selenium oxide is at a concentration of from about 0.1 M to about 0.5M and is dissolved in from about 0.1M to about 0.6M methanesulfonic acid.

* * * * *